United States Patent [19]

Sunami et al.

[11] 4,177,391

[45] Dec. 4, 1979

[54] CHARGE TRANSFER SEMICONDUCTOR DEVICE

[75] Inventors: Hideo Sunami; Masaharu Kubo, both of Hachioji; Iwao Takemoto, Kodaira, all of Japan

[73] Assignee: Hitachi, Ltd., Japan

[21] Appl. No.: 649,746

[22] Filed: Jan. 16, 1976

Related U.S. Application Data

[63] Continuation of Ser. No. 436,336, Jan. 24, 1974, abandoned.

[30] Foreign Application Priority Data

Jan. 24, 1973 [JP] Japan ........................ 48-9516

[51] Int. Cl.² .................. G11C 19/28; H01L 29/78
[52] U.S. Cl. .................................. 307/221 D; 357/24
[58] Field of Search ......... 357/24; 307/221 D, 221 C, 307/304; 179/15 BW, 15 A, 15.55 R, 15.55 T

[56] References Cited

U.S. PATENT DOCUMENTS

| 3,656,011 | 4/1972 | Weinberg | 357/24 |
| 3,763,480 | 10/1973 | Weimer | 357/24 |
| 3,787,852 | 1/1974 | Puckette et al. | 357/24 |
| 3,889,245 | 6/1975 | Gosney | 357/24 |

OTHER PUBLICATIONS

Tompsett, "Charge Transfer Devices", J. Vac. Sci. Technol., vol. 9 (7/72), pp. 1166-1181.
Melen et al., "One-Phase CCD: A New Approach to Charge Coupled Device Clocking", IEEE J. Solid-State Circuits, vol. SC-7 (2/72), pp.92-93.
Barna et al., Integrated Circuits in Digital Electronics, Wiley, N.Y., 1973, pp. 378-379.

*Primary Examiner*—William D. Larkins
*Assistant Examiner*—Gene M. Munson
*Attorney, Agent, or Firm*—Craig and Antonelli

[57] ABSTRACT

A charge transfer semiconductor device has the input signals of charge carriers divided successively; the successively divided input signals are transferred by more than two charge transfer semiconductor elements successively, and transferred input signals are successively combined and detected, whereby a high speed transferring operation of the input signals is accomplished.

21 Claims, 17 Drawing Figures

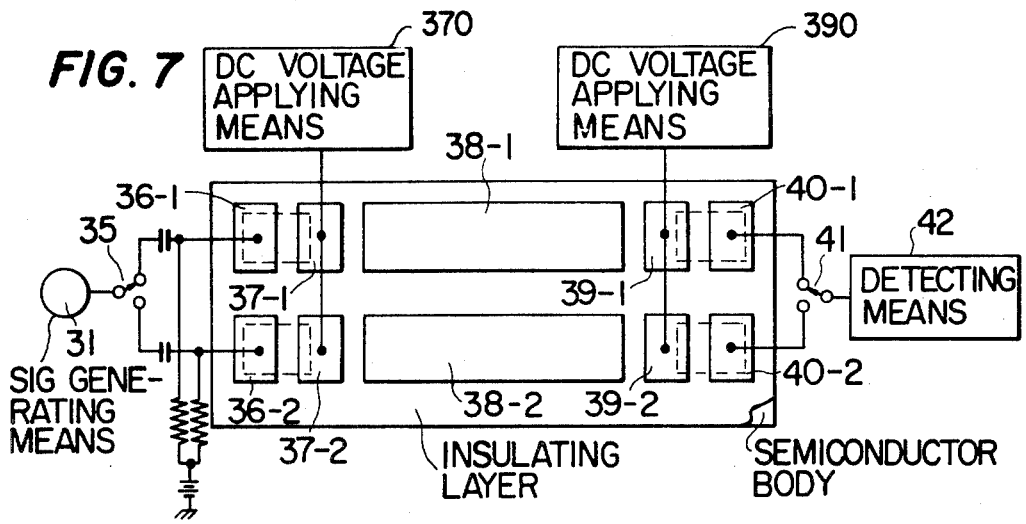
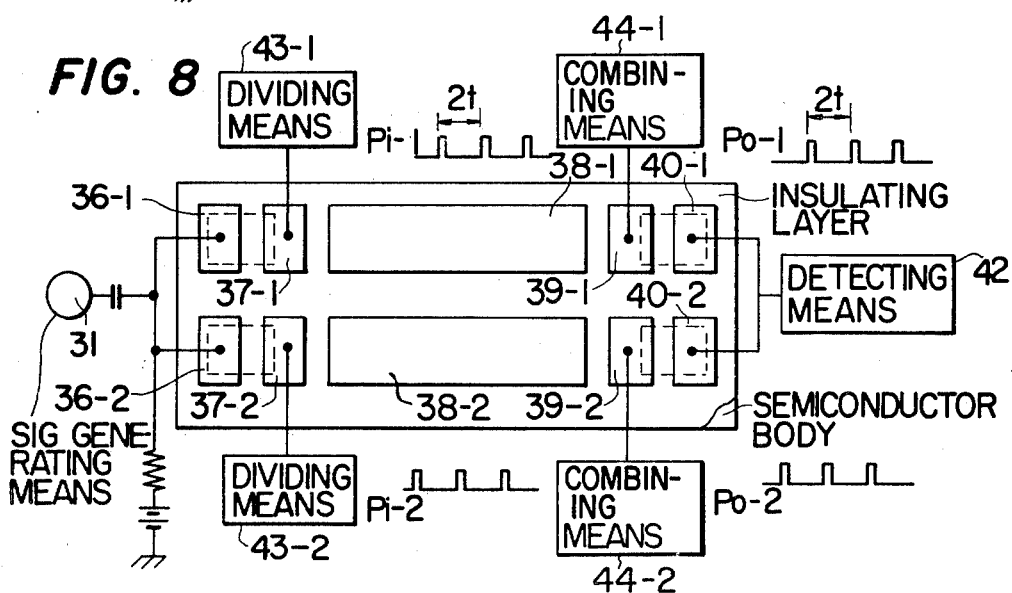
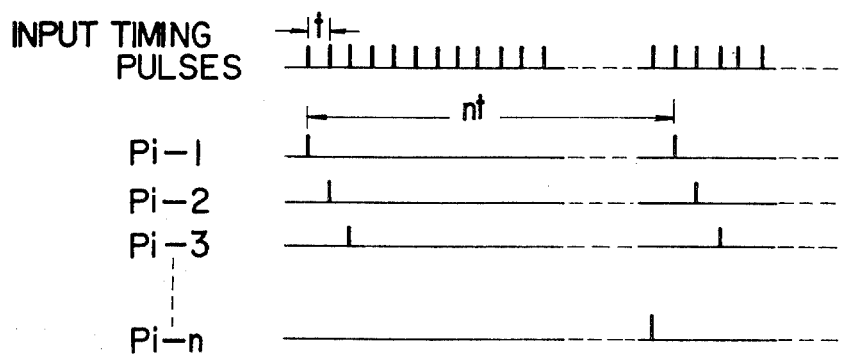

CHARGE TRANSFER SEMICONDUCTOR DEVICE

This is a continuation of application Ser. No. 436,336 filed Jan. 24, 1974, now abandoned.

BACKGROUND OF THE INVENTION

This invention relates to a charge transfer semiconductor device, such as a charge coupled semiconductor device, a bucket brigade device and a buried channel charge coupled semiconductor device and, more particularly, to a charge transfer semiconductor device having a new structure which is capable of effecting the high speed transferring operation of charge carrier input signals.

DESCRIPTION OF THE PRIOR ART

Recently, a shift resistor has been developed having a new structure which comprises a semiconductor body, an insulating layer disposed on one surface of the semiconductor body, means for introducing charge carriers into the semiconductor body, electrodes disposed separately on the insulating layer for storing charge carriers and for transferring the charge carriers along the surface of the body adjacent to the insulating layer, means for applying an electric field to the semiconductor body connected to the electrodes, and means for detecting transferred charge carriers.

This type of shift resistor has such a transferring operation mechanism of charge carriers that a direct voltage is applied to one of the electrodes so that a depletion region, that is, a potential well, is formed in the surface of the semiconductor body adjacent the insulating layer under the electrode, minority carriers introduced into the semiconductor body are stored in the potential well, a deeper potential well is formed in the semiconductor body under another electrode adjacent the electrode by applying, to the adjacent electrode, a direct voltage having a voltage higher than the direct voltage applied to the electrode, and the minority carriers stored in the shallow potential well are shifted to the deep potential well, that is, the minority carriers are transferred from the portion in the semiconductor body under the electrode to the portion in the semiconductor body under the adjacent electrode.

The principle and a fundamental structure of a charge coupled semiconductor device is described in detail in The Bell System Technical Journal, Volume 49, No. 4 Pages 587–593 (April, 1970), "Charge-Coupled Semiconductor Devices" by W. S. Boyle and G. E. Smith.

In the charge coupled semiconductor device, it has been necessary to have a high speed transferring operation of charge carriers and a high transferring efficiency in the high speed transferring operation. That is, although the charge carriers move very fast, upon being accelerated at a portion in the semiconductor body, under a gap between the electrodes, since between the potential wells, i.e., the portion in the semiconductor body under the gap between electrodes, there is a large potential gradient, i.e., an external drift field for the charge carriers, the charge carriers move mainly by diffusion at the portion in the surface of the semiconductor body under the electrode. Hence, the charge carriers move at a high speed by a large concentration gradient when they begin to move, being assisted by a self-induced electric field caused by a charge gradient of the charge carriers, but the movement of the charge carriers becomes slow as the movement proceeds, since the concentration gradient becomes small. This fact is described in the 1971 IEEE International Solid-State Circuits Conference, Digest of Technical Papers, FAM 13.1 "Carrier Transport in Charge Coupled Devices."

As is apparent from the above description, in the conventional charge transfer semiconductor devices, the speed of the transferring operation of the charge carriers is restricted by the diffusion time of the charge carriers in the surface of the semiconductor body under the electrode. Moreover, in the conventional charge transfer semiconductor devices, the transfer efficiency becomes low as the length of the electrode long and as the operating frequency of the charge transfer semiconductor devices becomes high.

In order to increase the speed of the transferring operation of the charge carriers, the transfer length may be shortened and, hence, the transfer time of the charge carriers may be shortened by reducing the length of the electrodes. However, when the length of an electrode is short, the signal-to-noise ratio decreases, since the amount of the charge carriers to be stored under the electrode becomes small. Also, it becomes difficult to fabricate an electrode having a short length.

BRIEF SUMMARY OF THE INVENTION

It is an object of the present invention to provide a charge transfer semiconductor device having a high transferring efficiency even in high speed transferring operation of the charge carriers.

It is another object of the present invention to provide a charge transfer semiconductor device which is capable of a high speed transfer operation of the charge carriers even if the electrodes are of the same dimension as that of the conventional charge transfer semiconductor device.

These objects of the present invention are realized by a charge transfer semiconductor device including more than two charge transfer semiconductor elements, each of which has signal input means, means for transferring charge carriers and signal output means; means for generating input signals; means for dividing the input signals, which is connected to the input signal generating means and is also connected to each of the signal input means, means for combining signals taken out from said signal output means, which is connected to each signal output means; and means for detecting combined signals connected to the combining means. In this charge transfer device, the input signals are periodically divided and, introduced into each said signal input means; the divided and introduced input signals are transferred in each charge transfer semiconductor element by the charge carriers transferring means and reach the signal output means; the transferred signals at the signal output means are combined successively by the combining means, and integrated signals are detected by the detecting means.

BRIEF DESCRIPTION OF THE DRAWINGS:

FIGS. 7 and 8 are plan views of concrete embodiments of the present invention;

FIG. 11 shows an example of input timing pulses and gate pulses utilized in the charge transfer semiconductor device shown in FIG. 10;

DETAILED DESCRIPTION OF THE PRIOR ART

Figure 1A:
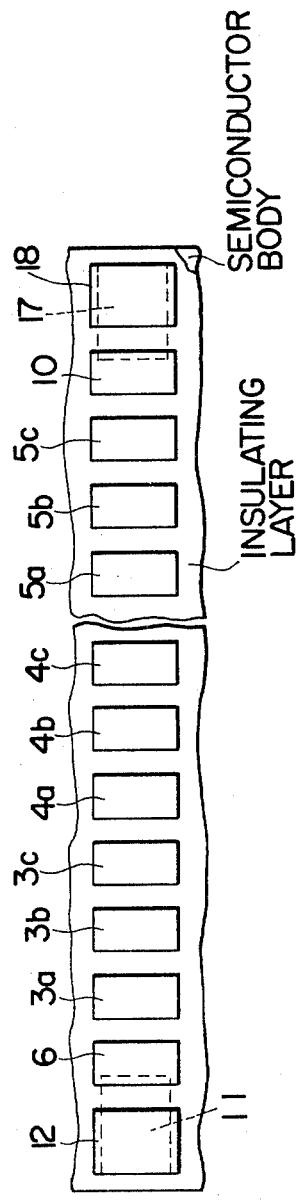
FIGS. 1a and 1b are respective plan and sectional views of a conventional charge coupled semiconductor device.
Figure 1B:
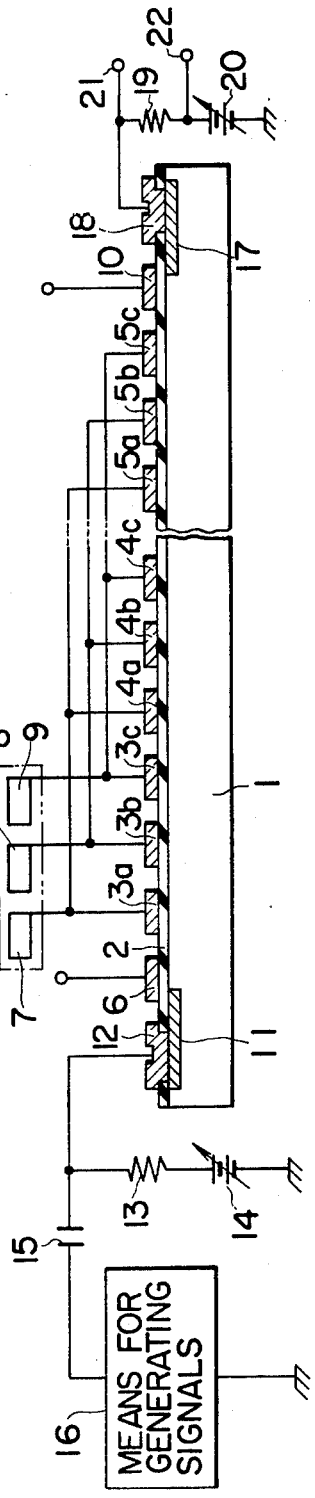

A conventional charge coupled semiconductor device is shown in FIGS. 1a and 1b and typically comprises a semiconductor body 1, an insulating layer 2 disposed on one surface of the semiconductor body 1, means for introducing charge carriers into the semiconductor body 1, electrodes 3a, 3b, 3c; 4a, 4b, 4c; ...; 5a, 5b, 5c, separately disposed on the insulating layer 2, for storing the introduced charge carriers and for transferring the charge carriers along the surface of the semiconductor body 1 adjacent the insulating layer 2, an input gate electrode 6 for directing the introduced charge carriers toward the electrode 3a, which is disposed on the insulating layer 2 corresponding to a portion between the introducing means and the electrode 3a, means 7, 8 and 9 connected to the electrodes 3a, 4a, ... 5a; 3b, 4b, ... 5b; and 3c, 4c, ..., 5c, respectively, for applying pulsed DC voltages for transferring the charge carriers along the surface of the semiconductor body 1, means for detecting the transferred charge carriers, and an output gate electrode 10 for directing transferred charge carriers toward the detecting means, which is disposed on the insulating layer 2 corresponding to a portion between the detecting means and the electrode 5c.

The means for introducing charge carriers as a signal comprises a semiconductor region 11 whose conductivity type is opposite to that of the semiconductor body 1, a power source 14 connected to the semiconductor region 11 through an electrode 12 and a resistor 13, which applies a bias voltage to the semiconductor region 11, and a signal source 16 connected to the electrode 12 through a coupling condenser 15. A signal input can also be controlled by the input gate electrode 6. That is, when a channel through which the charge carriers easily pass is formed at a surface portion of the semiconductor body 1 between the semiconductor region 11 and the portion below the electrode 3a by applying a voltage to the input gate electrode 6, the input signal is introduced into the semiconductor body 1 under the electrode 3a and, when no channel is formed, that is, no voltage is applied to the input gate electrode 6, the input signal is not introduced into the semiconductor body 1 under the electrode 3a.

The means for detecting the transferred charge carriers comprises a semiconductor region 17 whose conductivity type is opposite to that of the semiconductor body 1, a power source 20 connected to the semiconductor region 17 through an electrode 18 and a resistor 19, and terminals 21 and 22, which are connected between the electrode 18 and the resistor 19 and between the resistor 19 and the power source 20, respectively.

The polarities of the power sources 14 and 20 are connected as shown in FIG. 1b when the conductivity type of the semiconductor body is of p-type. When the semiconductor body 1 is of n-type, the polarities of the power sources 14 and 20 should be reversed.

Operation of this charge coupled semiconductor device will be explained hereinafter, referring FIG. 2 which shows a group of three-phase shift pulses and FIG. 3 which is a longitudinal section of the charge coupled semiconductor device shown in FIGS. 1a and 1b, with the essential portions enlarged.

Figure 2:
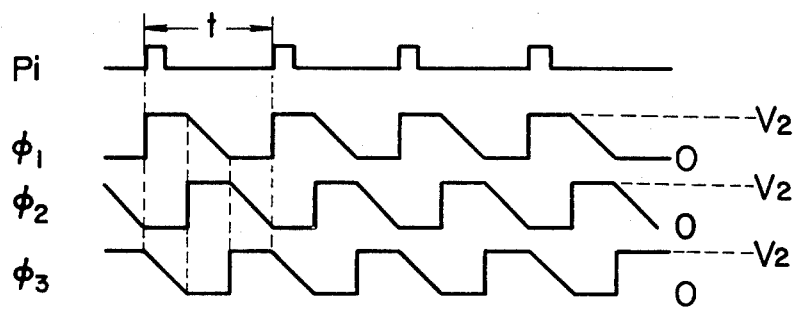
FIG. 2 shows an example of a group of three-phase shift pulses which are applied to electrodes of the charge coupled semiconductor device illustrated in FIGS. 1a and 1b.

In FIG. 2, Pi shows a typical example of pulses applied to the input gate electrode 6 in FIGS. 1a and 1b and $\phi_1$, $\phi_2$ and $\phi_3$ show a group of three-phase shift pulses which are generated by means 7, 8, and 9, respectively. The shift pulses $\phi_1$, $\phi_2$, and $\phi_3$ have similar wave forms and differ from each other by t/3 for one bit period t.

Figure 3:
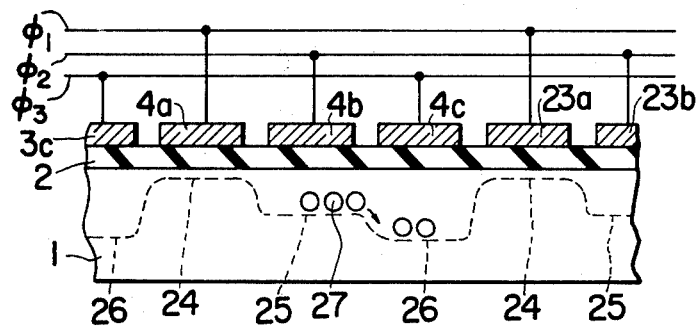
FIG. 3 is a sectional view of a part of the charge coupled semiconductor device illustrated in FIGS. 1a and 1b for explaining a function of the charge coupled semiconductor device.

Shown in FIG. 3 is a state of the charge coupled device in which the charge carriers are introduced and shifted along the surface of the semiconductor body 1. To the electrodes 3b, 4b, 23b, ... 5b, a voltage $V_1$ is applied and, hence, the introduced charge carriers are stored in the surface of the semiconductor body below the electrodes 3b, 4b, 23b, ... 5b. Next, to the electrodes 3c, 4c, 23c, ... 5c, a voltage $V_2$ is applied, so that potential wells 26 whose depths are deeper than those of potential wells 25 are formed under the electrodes 3c, 4c, 23c, ... 5c. By applying a voltage $V_2$, the stored charge carries 27 are transferred from the potential well 25 to the potential wells 26. Then, the voltage $V_2$ applied to the electrodes 3c, 4c, 23c, ... 5c, is changed to the voltage $V_1$ and the voltage $V_1$ applied to the electrodes 3b, 4b, 23b, ... 5b is taken off so that one step of the transfer of charge carriers is completed. The charge carriers move mainly by diffusion, being assisted by a self-induced electric field caused by a charge gradient of the charge carriers at a portion under the electrodes, that is, in the potential wells. Since there is a potential gradient, i.e., a drift field for the charge carriers 27, between the potential wells 24 and 25; and 25 and 26, i.e., the portions in the surface of the semiconductor body 1 under the gaps between the electodes 3a, 4a, 23a, ... 5a and 3b, 4b, 23b, ... 5b; and 3b, 4b, 23b, ...

5b and 3c, 4c, 23c, ... 5c, the charge carriers 27 are accelerated at these portions.

Although, in the above description, the voltages $V_2$ and $V_1$ are changed abruptly to the voltages $V_1$ and 0, respectively, for easy understanding of the operation of a charge coupled semiconductor device, in a practical sense, the voltage $V_2$ is changed gradually to 0 as shown in FIG. 2, so that the potential $V_1$ will occupy a prescribed value between the voltages $V_2$ and 0.

The polarities of the shift pulses are positive when the conductivity type of the semiconductor body is P-type, while when the semiconductor body has N-type conductivity, the polarities of the shiaft pulses are negative.

In the charge coupled semiconductor device, however, the movement of the charge carriers becomes slow as the transfer process proceeds, since the concentration gradient of the charge carriers become small.

Therefore, in the charge coupled semiconductor device, the speed of the transfer operation of the charge carriers is restricted by the diffusion time of the charge carriers along the surface of the semiconductor body 1 under the electrodes.

Now, when the transfer efficiency $\eta$ is defined as the ratio between the charge carriers stored under the electrode and the charge carriers transferred along the surface of the semiconductor body, it is indicated approximately by the equation:

$$\eta = 1 - (L^2/2 \mu t V) \quad (1)$$

wherein L is the length of the electrode toward the transferring direction of the charge carriers, $\mu$ is the mobility of the charge carriers, t is the transfer time and V is the voltage applied to the electrodes. Since the transferring efficiency is $\eta$, the remainder ratio $\epsilon$ of charge carriers is indicated by the equation:

$$\epsilon = 1 - \eta. \quad (2)$$

Figure 4:
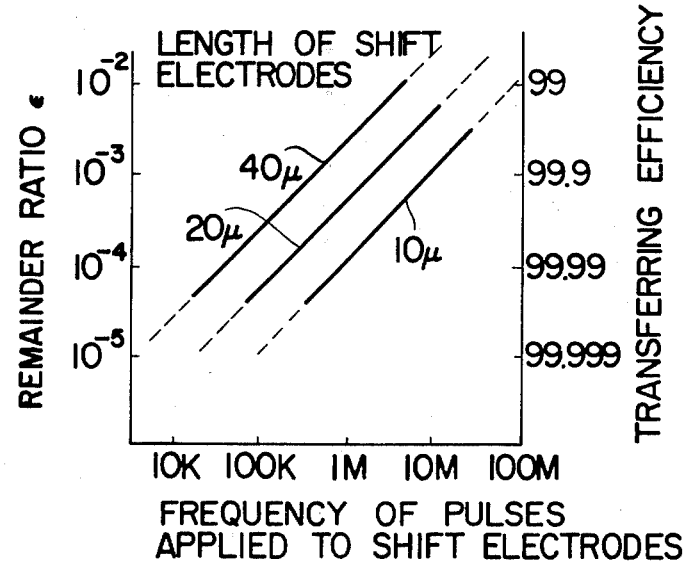
FIG. 4 is a graph showing a frequency characteristic of the charge coupled semiconductor device shown in FIGS. 1a and 1b.

Calculated results of the equations of the transferring efficiency $\eta$ and the remainder ratio $\epsilon$ are shown in FIG. 4 in which the relation between the transferring efficiency (the remainder ratio) and the frequency of pulses applied to the shift electrodes is given in the parameter of the lengths of shift electrodes. As is apparent from FIG. 4, the transfer efficiency decreases as the length of the shift electrodes increases and as the operation frequency of the charge coupled semiconductor device becomes high.

In the present invention, these defects are eliminated.

DETAILED DESCRIPTION OF THE INVENTION

Figure 5:
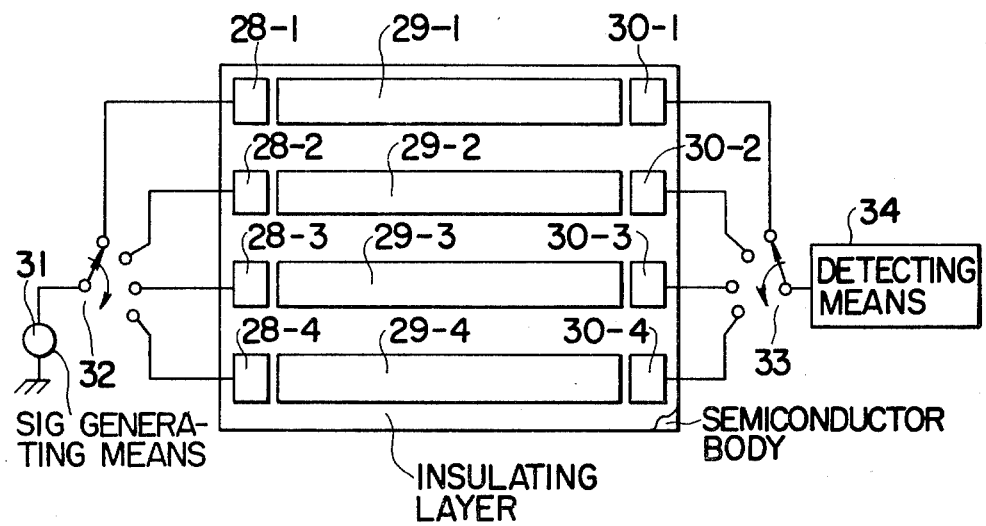
FIG. 5 is a conceptional view of a charge transfer semiconductor device of the present invention.
Figure 6:
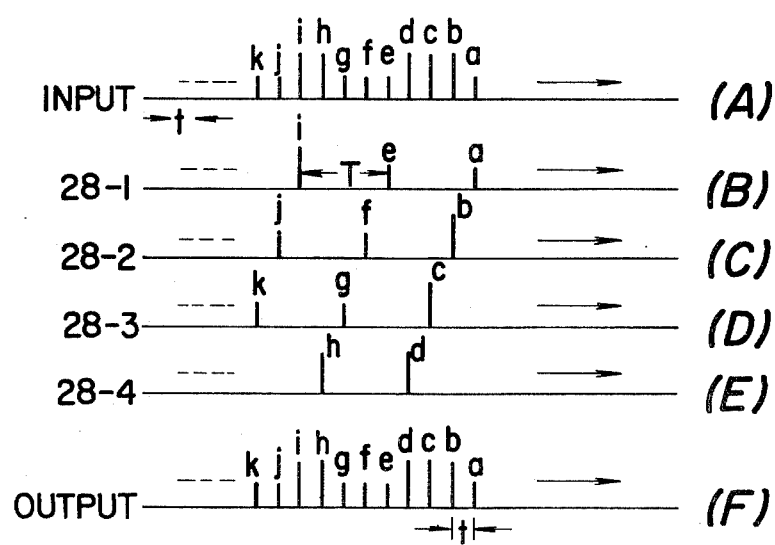
FIG. 6 shows an example of signals to be introduced into, transferred within and detected from the charge transfer semiconductor device illustrated in FIG. 5 for explaining a function of the present invention.

The fundamental concept of the present invention is explained by referring to FIGS. 5 and 6.

In FIG. 5, there is shown the construction of the fundamental concept of the present invention, which comprises four charge coupled semiconductor elements, each of which has a semiconductor body, an insulating layer disposed on one surface of the semiconductor body, signal input means 28-1 ... 28-4, means 29-1 ... 29-4 for transferring charge carriers and signal output means 30-1 ... 30-4, which are similar to those of the charge coupled semiconductor device shown in FIGS. 1a and 1b except for the circuit means for introducing and detecting charge carriers, that is, the resistors 13 and 19, the power sources 14 and 20, the condenser 15, the signal source 16, the terminals 21 and 22; means 31 for generating input signals; means 32 for dividing and distributing input signals which is connected to input signal generating means 31 and is also connected to each signal input means 28-1 ... 28-4 in the charge coupled semiconductor element; means 33 for combining signals taken out from signal output means 30-1 ... 30-4 in the charge coupled semiconductor elements, which is connected to each the signal output means, 30-1 ... 30-4; and means 34 for detecting the combined signals connected to the combining means 33.

In this charge transfer device, input signals a, b, c, d, e, f, g, h, i, j, k, ... whose time interval in each 1 bit is t and which is shown in (A) in FIG. 6 are divided periodically and introduced into the signal input means 28-1, 28-2, 28-3 and 28-4 successively. This is, into the signal input means 28-1, signals a, e, i, ... shown in (B) in FIG. 6 of the input signals, each of which is every fourth bit signal, are introduced; into the signal input means 28-2, 28-3 and 28-4, signals b, f, j, ... ; c, g, k, .. . ; and d, h, ... shown in (C), (D), and (E) in FIG. 6 are introduced, respectively; these divided and introduced input signals are transferred along the surface of the semiconductor body by transferring means 29-1, 29-2, 29-3 and 29-4 to the signal output means 30-1, 30-2, 30-3, and 30-4, respectively; the signals at the signal output means 30-1, 30-2, 30-3 and 30-4 are combined successively by the combining means 33; and combined signals are detected by the detecting means 34, whereby output signals a, b, c, d, e, f, g, h, i, j, k, ... are detected.

Although the input signals described above are pulsed signals, continuous signals such as voice and picture signals can also be utilized as the input signals.

In this charge transfer semiconductor device, a time interval T of the signals in one charge coupled semiconductor device becomes four times of the time interval t of the input signals. In other words, the operating frequency for transferring input signals in each charge coupled semiconductor element becomes one-fourth of that of a charge coupled semiconductor device in which the entire input signal having components a, b, c, d, e, f, g, h, i, j, k, ... is transferred. That is, when the operating frequency for transferring input signals, where the input signals are transferred by only one charge coupled semiconductor device, is F, the operating frequency for transferring input signals where four charge coupled semiconductor devices are utilized, as mentioned above, is one-fourth of F, i.e., F/4.

The transfer efficiency of the charge transfer semiconductor device shown in FIG. 5 may be compared with that of a charge coupled semiconductor device having only one charge coupled semiconductor element by referring to FIG. 4.

When the electrodes of the charge coupled semiconductor element have a length L, toward the transferring direction of the charge carriers, which is, for example, $10\mu$, and charge carriers are transferred in the charge coupled semiconductor device wherein only one charge coupled semiconductor element is utilized at an operating frequency of 10 MHz, the transfer efficiency is about 99.9%. In the charge transfer semiconductor device shown in FIG. 5 in which the length L of one of the electrodes is the same as that of the $10\mu$ electrode since the operating frequency becomes 2.5 MHz, the transferring efficiency is about 99.975%. That is, according to the charge transfer semiconductor device shown in FIG. 5, that is, the present invention, the transferring efficiency is significantly improved, even when the same dimensions of the electrodes as the charge coupled semiconductor device are utilized.

Moreover, the performance of the charge coupled semiconductor device is remarkably improved even when the transferring efficiency itself is the same as the afore-mentioned conventional device, since the transfer steps of the present invention are decreased.

In the charge transfer semiconductor device shown in FIG. 5, although four rows of charge coupled semiconductor elements are utilized, as is apparent for the above description, two or more charge coupled semiconductor elements can be utilized in the present invention. For example, when a charge transfer semiconductor device has ten rows of charge coupled semiconductor elements, the upper limit of the operating frequency is increased by one order of magnitude as compared with that of the charge coupled semiconductor device utilizing only one charge coupled semiconductor element. Moreover, the total transferring efficiency of the semiconductor device shown in FIG. 5 becomes ¼ power of that mentioned conventional device.

Shown in FIG. 7 is one embodiment of the present invention in which two charge coupled semiconductor elements are utilized, and input signals whose time period is t are introduced into the charge coupled semiconductor elements.

Input signals generated by means 31 for generating input signals are divided in every time period t and the divided signals are introduced into the signal input means 36-1 and 36-2 by means 35 for dividing and distributing the input signals. The input signals divided and introduced into the signal input means 36-1 and 36-2 are introduced into transferring parts of the charge coupled semiconductor elements by applying a pulsed voltage, whose time period is t, to input gate electrodes 37-1 and 37-2 from D.C. voltage applying means 370. These signals are transferred by transferring means 38-1 and 38-2, and reach the signal output means 40-1 and 40-2 by applying a pulsed voltage, from D.C. voltage applying means 390, whose time period is t to the output gate electrodes 40-1 and 40-2. The signals transferred through the two charge coupled semiconductor elements are combined by means 41 for integrating the transferred signals which is synchronized in its switching with the dividing and distributing means 35, and the combined signals are detected by detecting means 42.

As the dividing and distributing means 35 and the combining means, switching means utilizing MOS transistors can be used.

Another embodiment of the present invention is shown in FIG. 8.

In this embodiment, two charge coupled semiconductor elements are utilized as in the embodiment shown in FIG. 7, and the signal generating means 31 and the signal detecting means 42 are connected to the signal input means 36-1 and 36-2, and to the signal output means 40-1 and 40-2, respectively. Therefore, the input signals are directly introduded into the signal input means 36-1 and 36-2. To the input gate electrodes 37-1 and 37-2, means 43-1 and 43-2 for dividing the input signals are connected, respectively, The dividing means 43-1 and 43-2 generate pulses, whose time period is 2t and differ by a time period t from each other, which are shown in FIG. 8 as Pi-1 and Pi-2, respectively. By these dividing means 43-1 and 43-2, the input signals are mutually introduced into the transferring parts of the charge coupled semiconductor elements in every time period t. The introduced input signals are transferred by the transferring means 38-1 and 38-2, and reach the signal output means 40-1 and 40-2 mutually in every time period t through the output gate electrodes 39-1 and 39-2, to which pulses generated by combining means 44-1 and 44-2 are applied, synchronized with those of the dividing means, shown in FIG. 8 as Po-1 and Po-2, respectively. The signals mutually reaching the signal output means are detected by the detecting means 42.

In the embodiment shown in FIG. 8, although the combining means 44-1 and 44-2 are utilized, they may be omitted, since the last electrodes in the transferring means act as the combining means. In this case, only a D.C. voltage is applied to the output gate electrodes 39-1 and 39-2.

Figure 9:
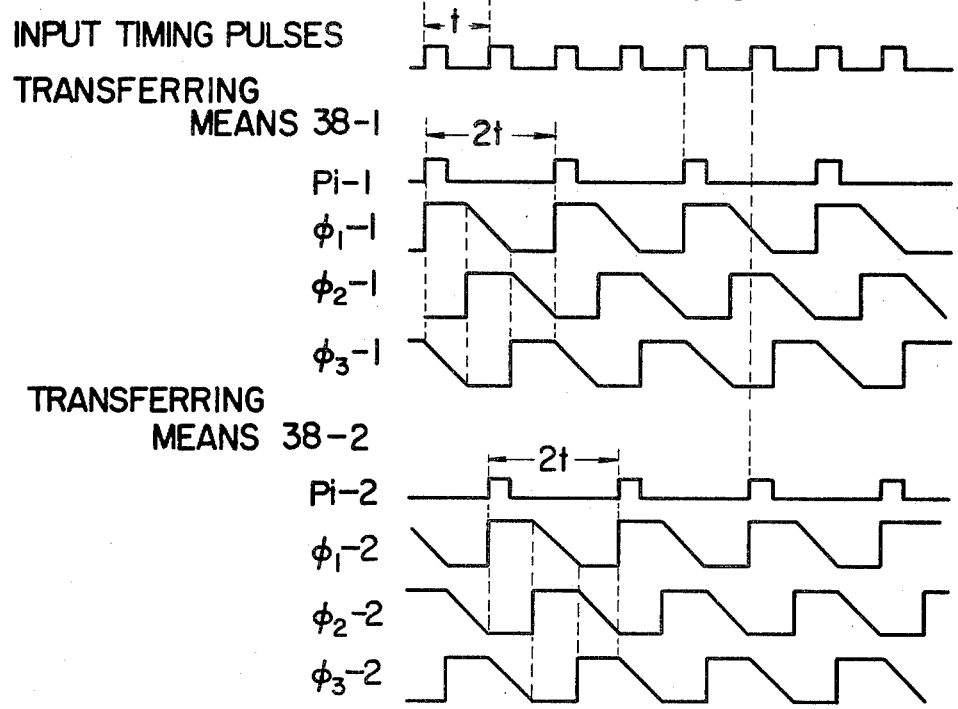
FIG. 9 shows a typical example of groups of three-phase shift pulses which are applied to electrodes of the charge transfer semiconductor device shown in FIG. 8.

A typical example of groups of three-phase shift pulses, for transferring signals through the transferring parts of the charge transfer semiconductor device shown in FIG. 8, is shown in FIG. 9. In FIG. 9, input timing pulses, pulses Pi-1 and Pi-2 generated by dividing means 43-1 and 43-2, and applied to the input gate electrodes 37-1 and 37-2, respectively, groups of three-phase shift pulses $\phi_1$-1, $\phi_2$-1 and $\phi_3$-1 utilized for the transferring means 38-1, and groups of three-phase shift pulses $\phi_1$-2, $\phi_2$-2 and $\phi_3$-2 utilized for the transferring means 38-2, are shown.

The time period of all the pulses generated by the dividing means 43-1 and the transferring means of 38-1 should be shifted by a time period t from that of all the pulses generated from the dividing means 43-2 and the transferring means 38-2, since the input signals are introduced mutually into the charge coupled semiconductor elements in every time period t and transferred through the transferring parts of the charge coupled semiconductor elements.

Figure 10:
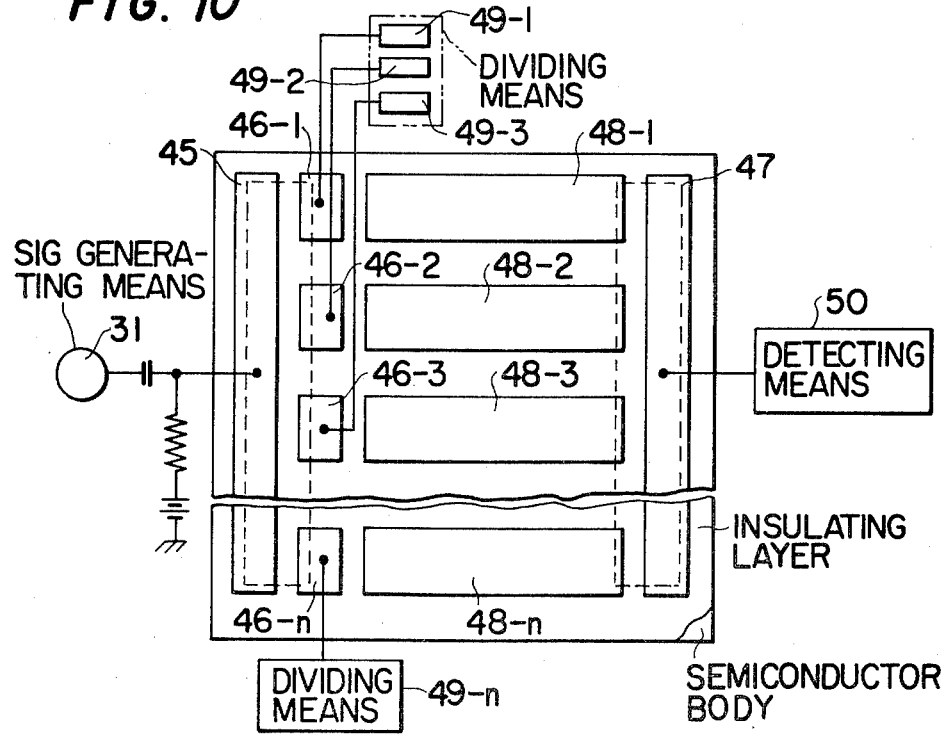
FIG. 10 is a plan view of one embodiment of the present invention.

A further embodiment of the present invention is shown in FIG. 10, in which one signal input means 45, in common with the input gate electrodes 46-1, 46-2, 46-3, ..., 46-n, and one signal output means 47, in common with transferring parts of transferring means 48-1, 48-2, 48-3, ..., 48-n in n parts of charge coupled semiconductor elements, are utilized. To the input gate electrodes 46-1, 46-2, 46-3, ..., 46-n, gate pulses whose time period is nt and shifted by the time period t from the pulses applied to the adjacent input gate electrode are supplied by dividing means 49-1, 49-2, 49-3, ..., 49-n, respectively. Those relationships of the time shift is the same among the shift pulses.

Shown in FIG. 11 are the input timing pulses and the gate pulses Pi-1, Pi-2, Pi-3, ..., Pi-n generated by the dividing means 49-1, 49-2, 49-3, ..., 49-n and are applied to the input gate electrodes 46-1, 46-2, 46-3, ..., 46-n, respectively.

As is apparent from FIG. 11, the time period of the input timing pulses is t, the time period of each of the gate pulses Pi-1, Pi-2, Pi-3, ..., Pi-n is nt, and the gate pulses Pi-1, Pi-2, Pi-3, ..., Pi-n are shifted by a time period t from each other.

When the input signals generated by the input generating means 31 are introduced into the signal input means 45, the input signal first introduced into the signal input means 45 is introduced into the transferring part of a first charge coupled semiconductor element, since the gate pulse is applied only to the gate input electrode 46-1. The second introduced input signal is introduced into the transferring part of a second charge coupled semiconductor element, since the gate pulse is applied only to the input gate electrode 46-2. The n-th introduced input signal is introduced into the transferring part of the n-th charge coupled semiconductor element, since the gate pulse is applied only to the input gate electrode 46-n. The signals introduced into the transferring parts are transferred by transferring means 48-1, 48-2, 48-3, ..., 48-n and reach the signal output means 47 successively. These signals are successively detected by detecting means 50.

In the embodiment shown in FIG. 10, n sections for generating a group of three-phase shift pulses should be employed and, hence, the charge transfer semiconductor device tends to become complex.

Figure 12:
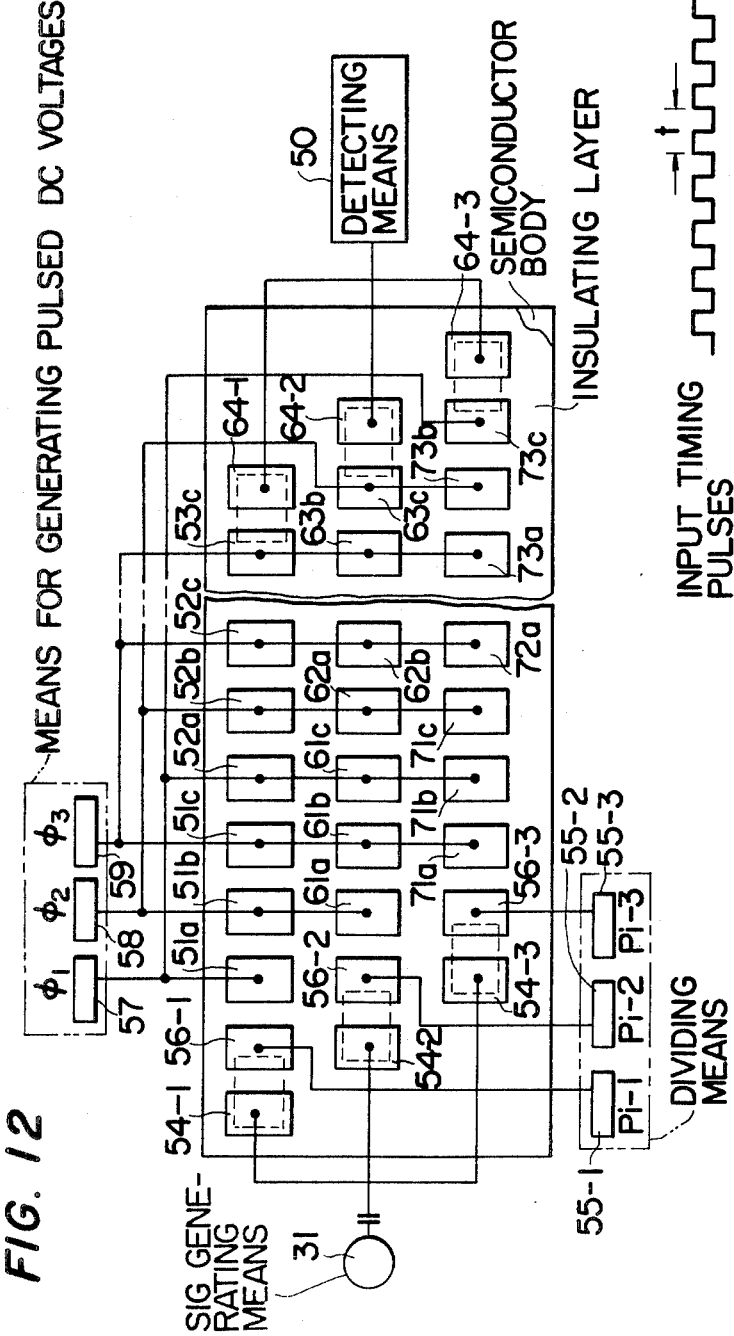
FIG. 12 is a plan view of another embodiment of the present invention.

A charge transfer semiconductor device in which the above-mentioned disadvantage is eliminated as shown in FIG. 12.

In this charge transfer semiconductor device, only one group of three-phase shift pulses is utilized. That is, input signals are introduced into the transfer parts of the charge transfer semiconductor device by applying gate pulses whose time period is three times that of the time period t of the input timing pulses, and transferred through the transferring parts by applying shift pulses whose phase difference is three times the time period t of the input timing pulses, as shown in FIG. 13.

Three-phase shift pulses $\phi_1$ are applied to each of the first electrodes of a trio of electrodes of the first charge coupled semiconductor element, that is, electrodes 51a, 52a, ...; to each of the third electrodes of the trio of electrodes of the second charge coupled semiconductor element, that is, electrodes 61c, ..., 63c; and to each of the second electrodes of the trio of electrodes of the third charge coupled semiconductor element, that is, electrodes 71b, ..., 73b. Three-phase shift pulses $\phi_2$ are applied to each of the second electrodes of the trio of electrodes of the first charge coupled semiconductor element, that is, electrodes 51b, 52b, ...; to each of the first electrodes of the trio of electrodes of the second charge coupled semiconductor element, that is, electrodes 61a, 62a, ...; and to each of third electrodes of the trio of electrodes of the third charge coupled semiconductor element, that is, electrodes 71c, ..., 73c. Three-phase shift pulses $\phi_3$ are applied to each of the third electrodes of the trio of electrodes of the first charge coupled semiconductor element, that is, electrodes 15c, 52c, ..., 53c; to each of the second electrodes of the trio of electrodes of the second charge coupled semiconductor element, that is, electrodes 61b, 62b, ..., 63b; and to each of the first electrodes of the trio of electrodes of the third coupled semiconductor element, that is, 71a, 72a, ..., 73a.

Figure 13:
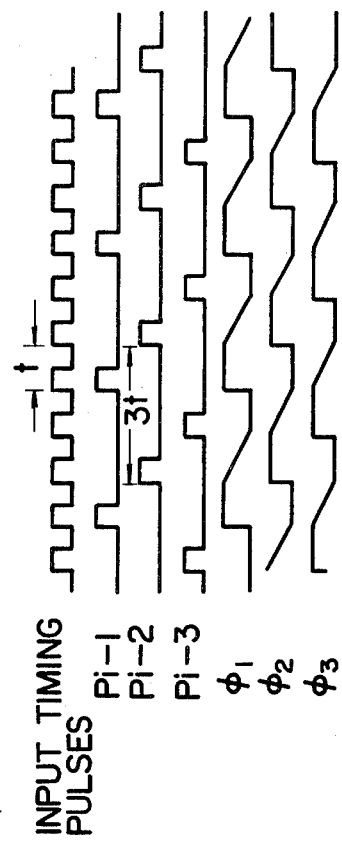
FIG. 13 shows an example of input timing pulses and gate pulses utilized in the charge transfer semiconductor device shown in FIG. 12, and an example of a group of three-phase shift pulses which are applied to electrodes of the charge transfer semiconductor device shown in FIG. 12.

Now, input signals, generated by signal generating means 31 and carried by input timing pulses, are introduced into signal input means 54-1, 54-2 and 54-3, and are directed to the transferring parts of the first, second and third charge coupled semiconductor elements, successively, by applying pulses Pi-1, Pi-2 and Pi-3 shown in FIG. 13, which are generated by dividing means 55-1, 55-2 and 55-3, to input gate electrodes 56-1, 56-2 and 56-3, respectively. The introduced and directed input signals are transferred by the three-phase shift pulses $\phi_1$, $\phi_2$ and $\phi_3$ which are generated by means 57, 58 and 59 for generating pulsed DC voltages, toward the last electrodes 53c, 63c, and 73c, respectively. The transfer signals are detected by detecting means 50 through output gate electrodes 64-1, 64-2 and 64-3, successively.

Although in the charge transfer semiconductor device input signals are transferred by the three-phase shift pulses as shown in FIG. 12, shift pulses other than three-phase shift pulses can be utilized. For example, two-phase shift pulses can be utilized in the charge transfer semiconductor device. At this case, for simplifying the means for generating pulsed DC voltages, the phase difference between the two-phase shift pulses should be an integral multiple of the time period of input signals. This is applicable to m-phase shift pulses. That is, the phase difference among the m-phase shift pulses should be an integral multiple of the period of the input signals. When the number of charge coupled semiconductor elements is n, the period of the input signals is t and the phase difference among m-phase shift pulses is nt/m, the relation of n=lm (l=1,2,3,...) should be maintained, for simplifying the means for generating pulsed DC voltages. At this time, sets of m-phase shift pulses are 1.

Although input gate electrodes 56-1, 56-2 and 56-3 are provided in the charge transfer semiconductor device shown in FIG. 12, the input gate electrodes are not always necessary and may be omitted, since input signals are introduced into the transferring part of each charge coupled semiconductor element only when the pulse of the three-phase shift pulses is applied to each of first electrodes 51a, 61a and 71a of the charge coupled semiconductor elements.

In the embodiments described above, only one input signal in the input signals having a time period t is introduced into the transferring part of the charge coupled semiconductor element while a single pulse is applied to the first electrode of the transferring part. In other words, the phase difference among pulses applied to the transferring part of one charge coupled semiconductor element and applied to the transferring part of the charge coupled semiconductor element adjacent the one charge coupled semiconductor element is the same as the time period of the input signals.

Figure 14:
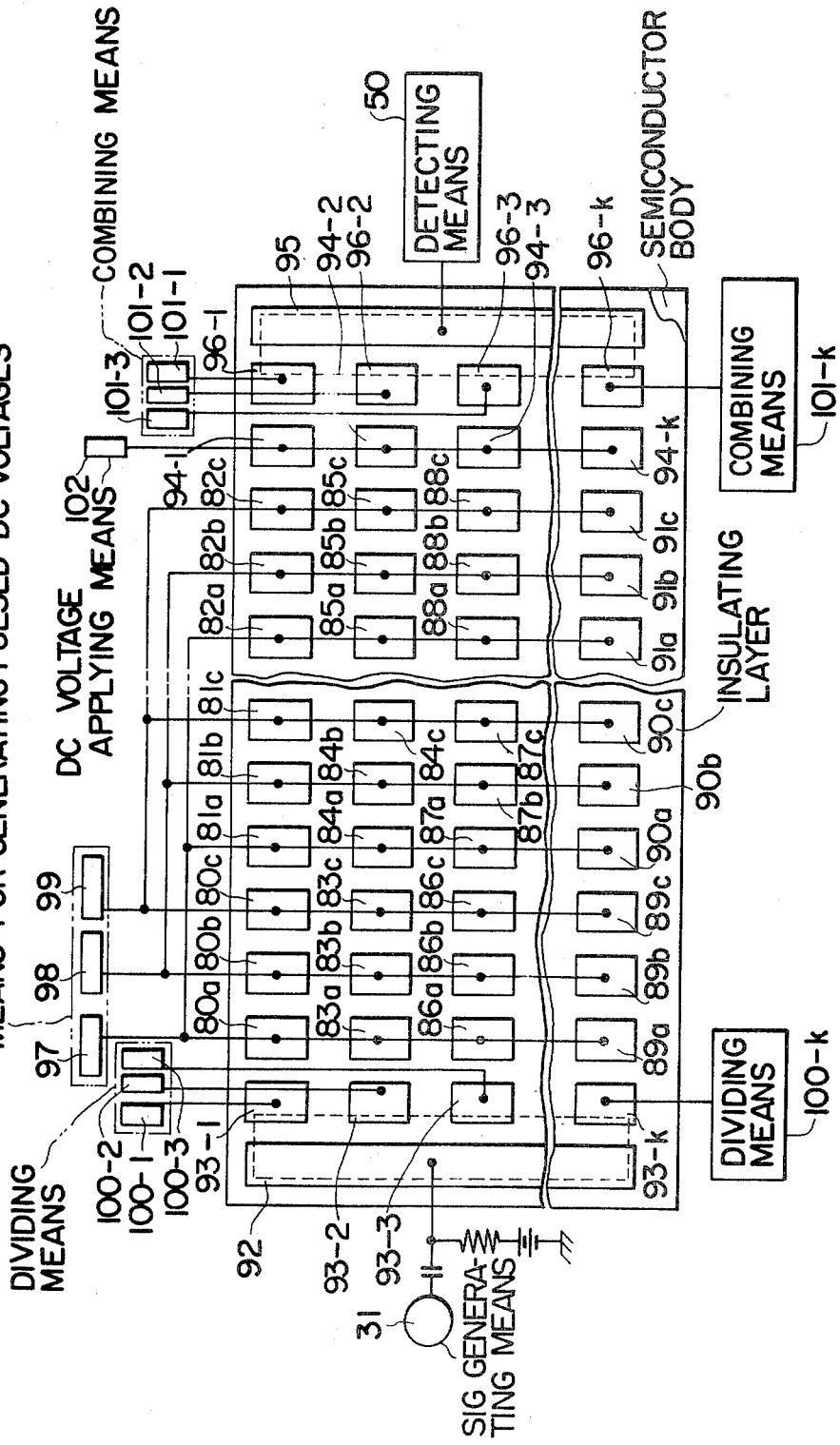
FIG. 14 is a plan view of a further embodiment of the present invention.

Shown in FIG. 14 is still a further embodiment of the present invention in which a desired number of input signals is introduced into one charge coupled semiconductor element during the application of a pulse to the transferring parts of the charge coupled semiconductor elements.

The charge transfer semiconductor device shown in FIG. 14 comprises a semiconductor body; an insulating layer disposed on the semiconductor body; k series of electrodes 80a, 80b, 81a, 81b, 81c, ... 82a, 82b, 82c; 83a, 83b, 83c, 84a, 84b, 84c, ..., 85a, 85b, 85c; 86a, 86b, 86c, 87a, 87b, 87c, ... 88a, 88b, 88c; ...; and 89a, 89b, 89c, 90a, 90b, 90c, ..., 91a, 91b, 91c, disposed on the insulating layer; signal input means 92; input gate electrodes 93-1, 93-2, 93-3, ..., 93k disposed on the insulating layer between the input means 92 and each series of electrodes; electrodes 94-1, 94-2, 94-3, ... 94k disposed adjacent each electrode of each series of electrodes; signal output means 95; output gate electrodes 96-1, 96-2, 96-3, ... 96-k disposed on the insulating layer between the output means 95 and each electrode 94 disposed adjacent each electrode of each series of electrodes; and signal detecting means 50.

To the first electrodes 80a, 81a, ... 82a, 83a, 84a, ..., 85a, 86a, 87a, ... 88a, ... 89a, 90a, ... 91a of the trios of electrodes in each series of electrodes, one of three-phase shift pulses, that is, $\phi_1$ which is generated by means 97 for generating pulsed DC voltages is applied; to the second electrodes 80b, 81b, ..., 82b, 83b, 84b, ..., 85b, 86b, 87b, ..., 88b, ... 89b, 90b, ... 91b of the trios of electrodes in each series of electrodes, one of three-phase shift pulses, that is, $\phi_2$ which is generated by means 98 for generating pulsed DC voltages is applied; and to the third electrodes 80c, 81c, . . . , 82c, 83c, 84c, . . . , 85c, 86c, 87c, . . . , 88c, . . . , 89c, 90c, . . . , 91c of the trios of electrodes in each series of electrodes, one of three-phase shift pulses, that is, $\phi_3$ which is generated by means 99 for generating pulsed DC voltages is applied.

To the input gate electrodes 93-1, 93-2, 93-3, . . . , 93-k, pulses generated by dividing means 100-1, 100-2, 100-3, . . . , 100-k are applied, respectively, and to the output gate electrodes 96-1 96-2, 96-3, . . . , 96-k, pulses generated by combining means 101-1, 101-2, 101-3, . . . , 101-k are applied respectively.

Figure 15:
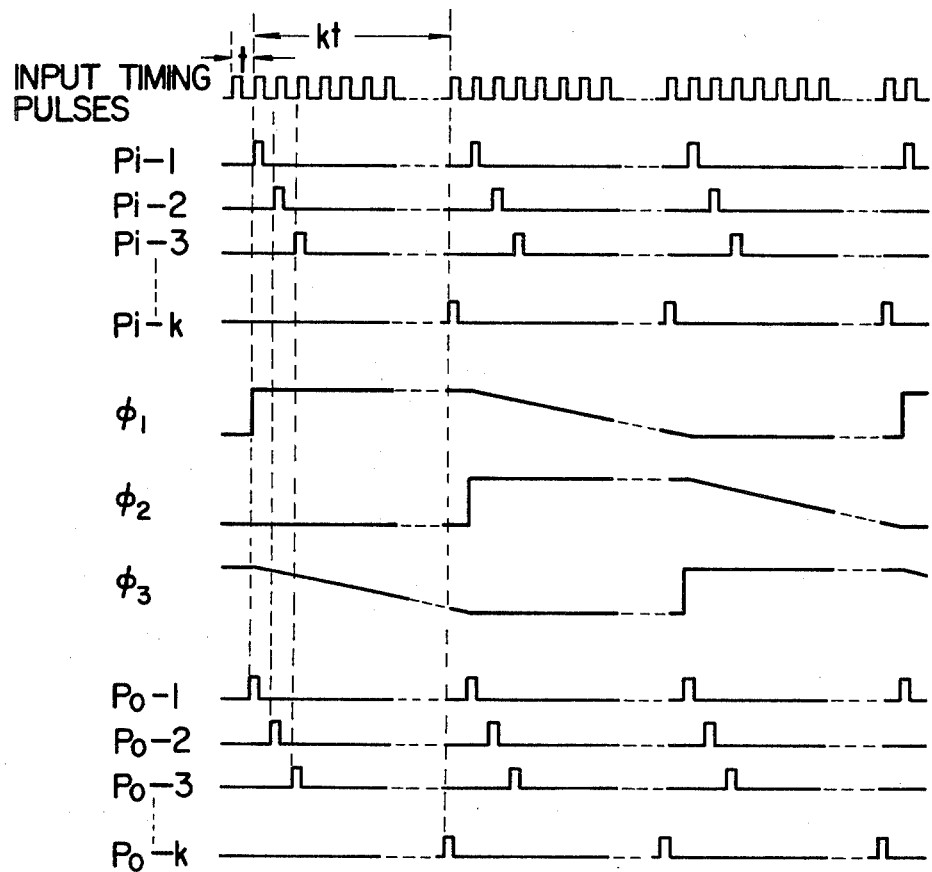
FIG. 15 shows an example of input timing pulses, input gate pulses, and output gate pulses utilized in the charge transfer semiconductor device shown in FIG. 14, and an example of a group of three-phase shift pulses which are applied to electrodes of the charge transfer semiconductor device shown in FIG. 14.

The relationships between input timing pulses, pulses Pi-1, Pi-2, Pi-3, . . . , Pi-k applied to the input gate electrodes 100-1, 100-2, 100-3, . . . , 100-k, respectively, the three-phase shift pulses $\phi_1$, $\phi_2$, $\phi_3$, and the pulses Po-1, Po-2, Po-3, . . . , Po-k applied to the output gate electrodes 96-1, 96-2, 96-3, . . . , 96-k, respectively are shown in FIG. 15.

As is apparent from FIG. 15, k signals are introduced into the charge coupled semiconductor elements during the application of one of the three-phase shift pulses, $\phi_1$ to the first electrode of the trios in the series of electrodes, and are transferred toward the output means by applying three-phase shift pulses to the series of electrodes. The transferred signals are stored below the electrodes 94-1, 94-2, 94-3, . . . , 94-k, successively, by D.C. voltage applying means 102 and the stored signals are successively detected by the detecting means 50 through the signal output means 95 by applying pulses Po-1, Po-2, Po-3, . . . , Po-k to the output gate electrodes 96-1, 96-2, 96-3, 96-k.

In the embodiment shown in FIG. 14, although a DC voltage is applied to the electrodes 94-1, 94-2, 94-3, . . . , 94-k, one of the three-phase shift pulses, e.g. $\phi_1$, may be applied to the electrodes 94-1, 94-2, 94-3, . . . , 94-k, in place of the application of DC voltage. Further, instead of the electrodes 94-1, 94-2, 94-3, . . . , 94-k, semiconductor regions whose conductivity type is opposite to that of the semiconductor body may be utilized.

Figure 16:
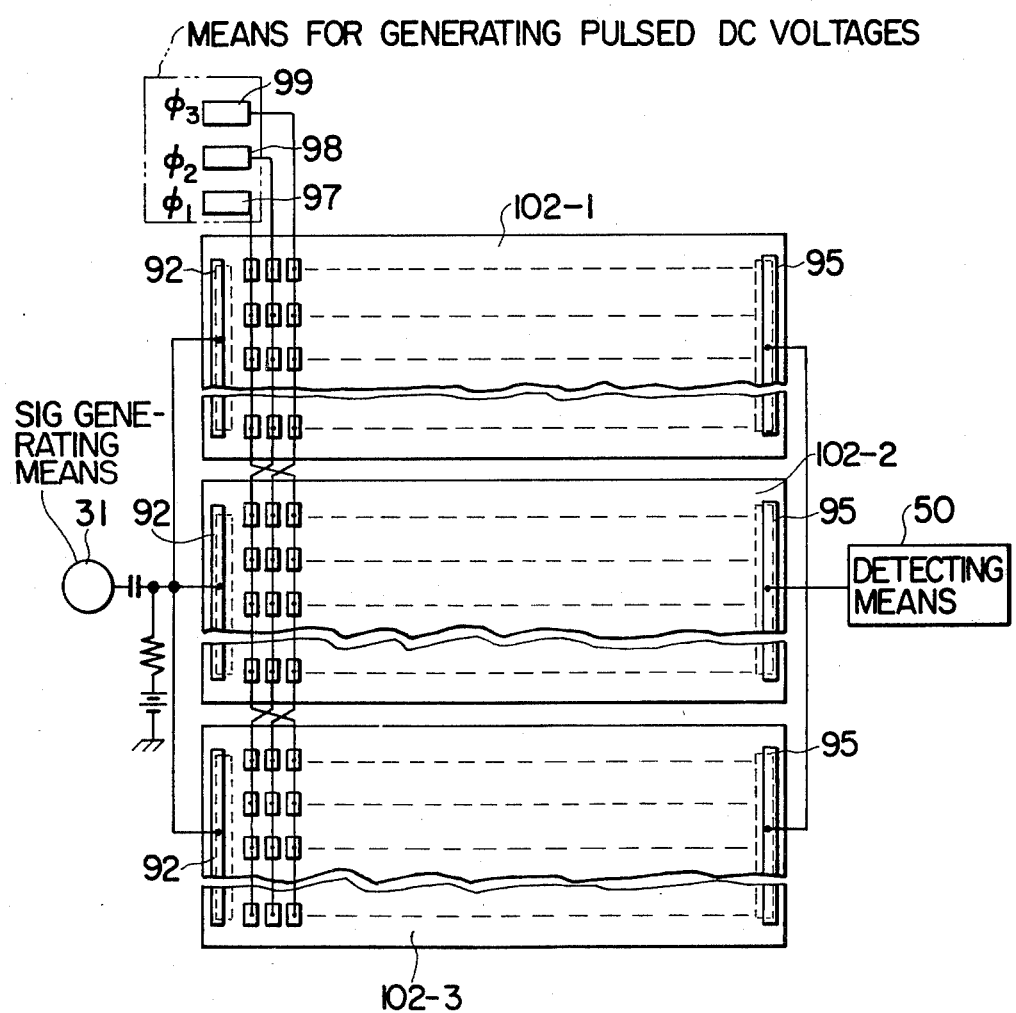
FIG. 16 is a plan view of still a further embodiment of the present invention.

Shown in FIG. 16 is a still further embodiment of the present invention, in which three of the charge transfer semiconductor devices shown in FIG. 14 are utilized. That is, since, in the charge transfer semiconductor device shown in FIG. 14, input signals are introduced into the charge coupled semiconductor elements during the application of only one of the three-phase shift pulses, that is $\phi_1$, input signals may be introduced into the charge coupled semiconductor elements during the application of the other of three-phase shift pulses, that is, $\phi_2$, or $\phi_3$. In other words, when k series of charge coupled semiconductor elements shown in FIG. 14 constitute one block, the number of blocks which can be utilized in one charge transfer semiconductor device should be the same as the number of the phases of shift pulses. That is, when input signals are transferred by three-phase shift pulses, the number of blocks should be three.

In FIG. 16, each of the blocks 102-1, 102-2 and 102-3 has the same configuration of elements as in the charge transfer device shown in FIG. 14. The three-phase shift pulses $\phi_1$, $\phi_2$ and $\phi_3$ which are generated pulsed DC voltage generating means 97, 98 and 99, respectively, are applied as shown in FIG. 16.

The input signals generated by input signal generating means 31 are introduced into the block 102-1 during the application of pulses $\phi_1$ of the three-phase shift pulses; into the block 102-2 during the application of pulses $\phi_2$ of the three-phase shift pulses; and into the block 102-3 during the application of pulses $\phi_3$ of the three-phase shift pulses. The introduced signals are transferred through the blocks 102-1, 102-2, 102-3 by three-phase shift pulses in the same manner in the charge transfer semiconductor device shown in FIG. 14, and are detected successively by the detecting means 50.

This conception utilizing k series of charge coupled semiconductor elements as one block is also applicable to the other embodiments shown in FIGS. 7, 8, 10 and 11.

According to this concept, the charge transfer semiconductor device is operated at a low frequency. That is, when the number of phases of shift pulses is m, and the number of charge coupled semiconductor elements is k, the time period of the shift pulses becomes m·k·t and, hence, the operating frequency of the input signals becomes 1/mk.

In the above explanations of the present invention, as the detecting means of the transferring charges, drains utilizing p-n junctions are used. In addition to drains, other detecting means are also applicable to the present invention, which are regeneration MOSTs utilizing the sensing diffusion regions described in IEEE Journal of Solid State Circuits, Volume SC-7, No. 3, pp. 237–242, (June 1972), "A Simple Charge Regenerator for Use With Charge Transfer Devices and the Design of Functional Logic Arrays," by M. F. Tompsett, and the floating gate amplifier described in ISSCC Dig. Tech. Papers, pp. 154–155 (Feb. 1973), "Analysis and Design of a Single-State Floating Gate Amplifier," by D. D. Wen and P. J. Salsbury.

In the regeneration MOST operation, the sensing diffusion region which is located at the surface of the semiconductor body, and has an opposite conductivity type of the said semiconductor body, and is connected to the gate of said MOST, has the role of detecting variably surface potential with the variable transferring charges.

In the floating gate amplifier operation, another electrode which is inserted into the insulator between the electrode of the pulsed DC voltages and the semiconductor body has the same role of the sensing diffusion region.

In the present invention all of the detecting means are applicable for detecting the transferring charges.

In the above-mentioned embodiments, although the charge transfer semiconductor device utilizing charge coupled semiconductor devices is shown, it will be understood that the present invention is also applicable to charge transfer semiconductor device in which bucket brigade devices, described in 1970 IEEE International Solid-State Circuits Conference, Digest of Technical Papers, pages 74 and 75, FHAM 6.5, "Integrated MOS and Bipolar Analog Delay Lines using Bucket-Brigade Capacitor Storage", or buried channel charge coupled semiconductor devices described in The Bell System Technical Journal, September, 1972, pp. 1635–1640, "Buried Channel Charge Coupled Device". Further, although the charge transfer semiconductor device utilizing charge coupled semiconductor devices in which three-phase shift pulses are utilized for transferring input signals is described in the above-mentioned embodiments, it will also be understood that the present invention is applicable to charge transfer semiconductor devices utilizing a charge coupled semiconductor device wherein two phase- or four-phase shift pulses are utilized.

While the invention has been explained in detail, it is to be understood that the technical scope of the invention is not limited to that of the foregoing embodiments but applicable to all charge transfer semiconductor devices as stated in the claims.

What we claim:

1. A charge transfer semiconductor device comprising:
    a plurality of parallel-spaced rows of charge transfer elements, each of which includes
        a semiconductor substrate along which charge carriers are to be transferred;
        signal input means for introducing charge carriers at a first selected location in said substrate;
        signal output means for producing an output signal representative of charge carriers which have been transferred thereto along said substrate, disposed at a second selected location in said substrate, spaced apart from said first selected location;
        signal transfer means including a plurality of electrodes electrically insulated from said substrate, and sequentially disposed along the surface of said substrate between said first and second selected locations, for transferring charge carriers between said signal input means and said signal output means;
        input gate means disposed between said first selected location and one end of said electrodes; and
        storage means, disposed between said second location and the other end of the electrodes of said transfer means, for temporarily storing charge carriers which have been transferred beneath said plurality of electrodes prior to being delivered to said signal output means, each of said storage means being disposed in parallel spaced apart relationship with the other storage means, so that the plurality of storage means of said rows form a column of storage means perpendicular to said rows;
    first means, connected to the signal input means of said charge transfer elements, for providing an input signal into the signal input means of the respective ones of said plurality of parallel-spaced rows of charge transfer elements;
    a plurality of respective second means, each of which is connected to each respective input gate means of each charge transfer element, for selectively applying a respective voltage pulse to each respective input gate means, shifted in time with respect to the respective pulses applied to each other input gate means, whereby charge carriers are introduced into said substrate;
    third means, connected to the signal transfer means of said charge transfer elements, for effecting the sequential transfer of introduced charge carriers along said substrate beneath the signal transfer means of the respective ones of said plurality of charge transfer elements, said third means including a prescribed number of plural voltage transfer pulse generators for applying a prescribed number of voltage transfer pulses to the plurality of electrodes of each row, shifted in time with respect to one another, so that the voltage transfer pulse applied to a respective electrode of the plurality of electrodes of each row is shifted in time with respect to the voltage transfer pulses applied to adjacent electrodes of that particular row, and is applied in common to adjacent parallel electrodes of the other signal transfer means, said prescribed number of plural voltage transfer pulse generators being less than the number of parallel-spaced rows of charge transfer elements, and the frequency of said voltage transfer pulses being less than the frequency of the voltage pulses selectively applied by said second means; and
    fourth means, connected to the signal output means of said charge transfer elements, for detecting said transferred charge carriers as an output signal.

2. A charge transfer semiconductor device according to claim 1, wherein each of said charge transfer elements is integrated into the same semiconductor substrate which has an insulating film disposed over the surface thereof, and wherein said plurality of electrodes are disposed along the surface of said insulating film.

3. A charge transfer semiconductor device according to claim 2, wherein said input gate means of each of said charge transfer elements is an electrode, and is disposed on said insulating film.

4. A charge transfer semiconductor device according to claim 3, wherein the voltage pulses selectively applied by a respective second means to a respective charge transfer element are shifted in time by a period t relative to the voltage pulses selectively applied by an adjacent respective second means to an adjacent respective charge transfer means and the period of each voltage pulse is equal to the product of the number of charge transfer elements making up the plurality of charge transfer elements and said time period t.

5. A charge transfer semiconductor device according to claim 2, wherein said substrate has prescribed conductivity type and each of said signal input means comprises a respective semiconductor region, having a conductivity type opposite to that of said substrate, disposed at said first selected location in said substrate.

6. A charge transfer semiconductor device according to claim 5, wherein said respective semiconductor region of said signal input means is electrically connected to another respective semiconductor region of another signal input means within the substrate.

7. A charge transfer semiconductor device according to claim 6, wherein said substrate has a prescribed conductivity type and each of said signal output means comprises a respective semiconductor region having a conductivity type opposite to that of said substrate, disposed at said second selected location in said substrate, and wherein said respective semiconductor region of said signal output means is electrically connected to another respective semiconductor region of another signal output means within the substrate.

8. A charge transfer semiconductor device according to claim 7, wherein the signal input means and the signal output means comprises a first electrode connected to said semiconductor region of said signal input means and being common to another signal input means, and a second electrode connected to said semiconductor region of said signal output means and being common to another signal output means, respectively.

9. A charge transfer semiconductor device according to claim 5, wherein each of said signal output means comprises a respective semiconductor region, having a conductivity type opposite to that of said substrate, disposed at said second selected location in said substrate.

10. A charge transfer semiconductor device according to claim 1, wherein each of said charge transfer elements further includes output gate means disposed between said second location and the other end of the said electrodes, and further comprising a plurality of fifth means, each of which is connected to each respective output gate means of each charge transfer element, for selectively applying a respective voltage pulse to each respective output gate means, synchronized with that applied to each respective input gate means by said second means.

11. A charge transfer semiconductor device according to claim 10, wherein each of said charge transfer elements is integrated into the same semiconductor substrate which has an insulating film disposed over the surface thereof, and wherein said plurality of electrodes are disposed along the surface of said insulating film.

12. A charge transfer semiconductor device according to claim 11, wherein said input gate means and said output gate means are electrodes and are disposed on said insulating film.

13. A charge transfer semiconductor device according to claim 12, wherein the voltage pulses selectively applied by a respective second means to a respective charge transfer element are shifted in time by a period t relative to the voltage pulses selectively applied by an adjacent respective second means to an adjacent respective charge transfer means and the period of each voltage pulse is equal to the product of the number of charge transfer elements making up the plurality of charge transfer elements and said time period t.

14. A charge transfer semiconductor device according to claim 11, wherein said substrate has a prescribed conductivity type and each of said signal input means comprises a respective semiconductor region, having a conductivity type opposite to that of said substrate, disposed at said first selected location in said substrate.

15. A charge transfer semiconductor device according to claim 14, wherein said respective semiconductor region of said signal input means is electrically connected to another respective semiconductor region of another signal input means within the substrate.

16. A charge transfer semiconductor device according to claim 15, wherein each of said signal output means comprises a respective semiconductor region having a conductivity type opposite to that of said substrate, disposed at said second selected location in said substrate, and wherein said respective semiconductor region of said signal output means is electrically connected to another respective semiconductor region of another signal output means within the substrate.

17. A charge transfer semiconductor device according to claim 16, wherein the signal input means and the signal output means comprise a first electrode connected to said semiconductor region of said signal input means and being common to another signal input means, and a second electrode connected to said semiconductor region of said signal output means and being common to another signal output means, respectively.

18. A charge transfer semiconductor device according to claim 14, wherein each of said signal output means comprises a respective semiconductor region, having a conductivity type opposite to that of said substrate, disposed at said second selected location in said substrate.

19. A charge transfer semiconductor device according to claim 1, wherein the voltage pulses selectively applied by a respective second means to a respective charge transfer element are shifted in time by a period t relative to the voltage pulses selectively applied by an adjacent respective second means to an adjacent respective charge transfer means and the period of each voltage pulse is equal to the product of the number of charge transfer elements making up the plurality of charge transfer elements and said time period t.

20. A charge transfer semiconductor device according to claim 1, wherein said storage means comprises a further electrode electrically insulated from said substrate and D.C. voltage applying means, coupled thereto, for applying to said further electrode a voltage to cause carriers to be transferred from said other end of said electrodes to said storage means.

21. A charge transfer semiconductor device according to claim 1, wherein said substrate has a prescribed conductivity type and said storage means comprises a semiconductor region of a conductivity type opposite to that of said substrate.

* * * * *